(12) United States Patent
Seemann (10) Patent No.: US 11,899,516 B1
(45) Date of Patent: Feb. 13, 2024

(54) CREATION OF A DIGITAL TWIN FOR AUTO-DISCOVERY OF HIERARCHY IN POWER MONITORING

(71) Applicant: T-Mobile USA, Inc., Bellevue, WA (US)

(72) Inventor: Sean Seemann, Seattle, WA (US)

(73) Assignee: T-Mobile USA, Inc., Bellevue, WA (US)

( * ) Notice: Subject to any disclaimer, the term of this patent is extended or adjusted under 35 U.S.C. 154(b) by 0 days.

(21) Appl. No.: 18/352,053

(22) Filed: Jul. 13, 2023

(51) Int. Cl.
*G06F 1/28* (2006.01)
*G06F 17/18* (2006.01)

(52) U.S. Cl.
CPC ............... *G06F 1/28* (2013.01); *G06F 17/18* (2013.01)

(58) Field of Classification Search
CPC .................................. G06F 1/28; G06F 17/18
See application file for complete search history.

(56) References Cited

U.S. PATENT DOCUMENTS

| | | | |
|---|---|---|---|
| 3,914,757 A | 10/1975 | Finlay et al. |
| 3,924,224 A | 12/1975 | Dyer |
| 4,255,707 A | 3/1981 | Miller |
| 4,291,375 A | 9/1981 | Wolf |
| 4,596,144 A | 6/1986 | Panton et al. |
| 5,625,685 A | 4/1997 | Allegranza et al. |
| 5,724,976 A | 3/1998 | Mine et al. |
| 6,405,370 B1 | 6/2002 | Jarrell |
| 6,429,785 B1 | 8/2002 | Griffin et al. |
| 6,675,071 B1 | 1/2004 | Griffin et al. |
| 6,947,854 B2 | 9/2005 | Swarztrauber et al. |
| 7,089,125 B2 | 8/2006 | Sonderegger |
| 7,271,735 B2 | 9/2007 | Rogai |
| 7,272,518 B2 | 9/2007 | Bickel et al. |
| 7,423,546 B1 | 9/2008 | Aisa |
| 7,865,320 B2 | 1/2011 | Long et al. |
| 8,121,741 B2 | 2/2012 | Taft et al. |
| 8,165,834 B2 | 4/2012 | Long et al. |
| 8,819,018 B2 | 8/2014 | Fisera et al. |
| 9,130,403 B2 | 9/2015 | Sharma et al. |
| 9,568,392 B2 | 2/2017 | Peleg et al. |
| 9,568,522 B2 | 2/2017 | Aiello et al. |

(Continued)

FOREIGN PATENT DOCUMENTS

| | | |
|---|---|---|
| CA | 111598942 A | 8/2020 |
| CN | 106443566 B | 3/2019 |

(Continued)

*Primary Examiner* — Zahid Choudhury
(74) *Attorney, Agent, or Firm* — Perkins Coie LLP (57) ABSTRACT

Introduced herein is a computer-implemented system for creating a digital twin of an electrical system using auto-discovery techniques. The system receives power data from meters in an electrical system. For each meter, the system captures a power profile related to a component connected to the meter and creates a set of delta data representing change in power over time. The system detects correlated changes by comparing the sets of delta data and generates a system dataset by combining the sets of delta data. The system detects echoes of power fluctuations of the electrical system from the system dataset. The system creates a digital twin of the electrical system, where the digital twin includes a one-line diagram representing connections between components in the electrical system.

20 Claims, 5 Drawing Sheets

(56) References Cited

U.S. PATENT DOCUMENTS

| | | | |
|---|---|---|---|
| 9,799,083 B2 | 10/2017 | Steigler | |
| 9,816,836 B2 | 11/2017 | Steigler | |
| 10,088,348 B2 | 10/2018 | Xu et al. | |
| 10,228,413 B2 | 3/2019 | Castelli et al. | |
| 10,310,459 B2 | 6/2019 | Gross et al. | |
| 10,393,793 B1 | 8/2019 | Nguyen et al. | |
| 10,418,811 B2 | 9/2019 | Konya et al. | |
| 10,504,194 B2 | 12/2019 | Steigler | |
| 10,620,256 B2 | 4/2020 | Bilic et al. | |
| 10,663,503 B2 | 5/2020 | Pigeon | |
| 10,742,068 B2 | 8/2020 | De Callafon et al. | |
| 10,746,783 B2 | 8/2020 | Castelli et al. | |
| 10,803,535 B2 | 10/2020 | Pankanti et al. | |
| 10,862,302 B1 | 12/2020 | Eyford et al. | |
| 10,937,114 B2 | 3/2021 | Franklin et al. | |
| 11,181,568 B2 | 11/2021 | Léonard et al. | |
| 11,221,353 B2 | 1/2022 | Menzel et al. | |
| 11,249,120 B2 | 2/2022 | Chen et al. | |
| 11,322,976 B1 * | 5/2022 | Anderson | G06N 3/044 |
| 11,499,999 B2 * | 11/2022 | Lange | G06N 3/088 |
| 11,513,148 B2 | 11/2022 | Carignan et al. | |
| 11,580,794 B2 | 2/2023 | Korchev et al. | |
| 11,646,602 B2 | 5/2023 | Cardozo et al. | |
| 11,652,634 B2 * | 5/2023 | Covaci | H04L 9/3297 |
| | | | 713/168 |
| 2006/0004679 A1 | 1/2006 | Cahill-obrien et al. | |
| 2006/0091877 A1 | 5/2006 | Robinson et al. | |
| 2011/0153246 A1 | 6/2011 | Donaldson et al. | |
| 2012/0078547 A1 | 3/2012 | Murdoch | |
| 2014/0278162 A1 | 9/2014 | Riley et al. | |
| 2014/0347077 A1 | 11/2014 | Donaldson et al. | |
| 2017/0286572 A1 * | 10/2017 | Hershey | B64F 5/60 |
| 2018/0106640 A1 * | 4/2018 | Padrones | G01R 22/066 |
| 2021/0292131 A1 | 9/2021 | Drahohs-föderler et al. | |
| 2021/0341519 A1 | 11/2021 | Meranda et al. | |
| 2021/0397770 A1 * | 12/2021 | Bompard | G06N 5/01 |
| 2022/0050128 A1 | 2/2022 | Menzel et al. | |
| 2022/0050130 A1 | 2/2022 | Song et al. | |
| 2022/0163602 A1 | 5/2022 | Stenberg et al. | |
| 2023/0075892 A1 | 3/2023 | Carignan et al. | |

FOREIGN PATENT DOCUMENTS

| | | | |
|---|---|---|---|
| CN | 106291030 B | 4/2019 | |
| CN | 111625991 A | 9/2020 | |
| CN | 112601967 A | 4/2021 | |
| CN | 111486911 B | 11/2021 | |
| CN | 113687176 B | 2/2022 | |
| CN | 113433383 B | 4/2022 | |
| CN | 110687874 B | 1/2023 | |
| CN | 115166619 B | 3/2023 | |
| DE | 102017125180 A1 | 10/2018 | |
| DE | 102018133117 A1 | 6/2020 | |
| DE | 102020117892 A1 | 2/2021 | |
| EP | 0360511 A2 | 3/1990 | |
| EP | 0248137 B1 | 7/1993 | |
| EP | 1260090 A1 | 11/2002 | |
| EP | 1119930 B1 | 3/2005 | |
| EP | 1456676 B1 | 3/2006 | |
| EP | 1782317 A2 | 5/2007 | |
| EP | 1548451 B1 | 6/2007 | |
| EP | 2088437 A1 | 8/2009 | |
| EP | 2528033 A1 | 11/2012 | |
| EP | 2791744 A2 | 10/2014 | |
| EP | 2805172 A1 | 11/2014 | |
| EP | 2387814 B1 | 11/2016 | |
| EP | 3410554 B1 | 12/2019 | |
| EP | 3709671 A1 | 9/2020 | |
| EP | 3735759 A1 | 11/2020 | |
| EP | 3844509 A1 | 7/2021 | |
| EP | 3855593 A1 | 7/2021 | |
| EP | 3081949 B1 | 9/2021 | |
| EP | 3618214 B1 | 9/2021 | |
| EP | 3893071 A1 | 10/2021 | |
| EP | 1805523 B1 | 4/2023 | |
| JP | 4705755 B2 | 3/2011 | |
| JP | 4903884 B2 | 1/2012 | |
| JP | 5249429 B2 | 4/2013 | |
| JP | 5749290 B2 | 5/2015 | |
| JP | 6419207 B2 | 10/2018 | |
| KR | 20210055716 A | 5/2021 | |
| KR | 102299122 B1 | 9/2021 | |
| WO | 9516200 A1 | 6/1995 | |
| WO | 9621264 A2 | 7/1996 | |
| WO | 0022760 A1 | 4/2000 | |
| WO | 0040976 A1 | 7/2000 | |
| WO | 0040977 A1 | 7/2000 | |
| WO | 0137221 A1 | 5/2001 | |
| WO | 0165823 A1 | 9/2001 | |
| WO | 03055031 A2 | 7/2003 | |
| WO | 2005084197 A2 | 9/2005 | |
| WO | 2006026362 A2 | 3/2006 | |
| WO | 2006044035 A2 | 4/2006 | |
| WO | 2007005547 A1 | 1/2007 | |
| WO | 2007048363 A1 | 5/2007 | |
| WO | 2008142398 A1 | 11/2008 | |
| WO | 2009135940 A2 | 11/2009 | |
| WO | 2009158202 A1 | 12/2009 | |
| WO | 2010007369 A2 | 1/2010 | |
| WO | 2010083164 A2 | 7/2010 | |
| WO | 2010129414 A1 | 11/2010 | |
| WO | 2011001188 A2 | 1/2011 | |
| WO | 2011092265 A2 | 8/2011 | |
| WO | 2012004418 A2 | 1/2012 | |
| WO | 2012098467 A2 | 7/2012 | |
| WO | 2013106923 A1 | 7/2013 | |
| WO | 2014201348 A1 | 12/2014 | |
| WO | 2016064889 A1 | 4/2016 | |
| WO | 2017181272 A1 | 10/2017 | |
| WO | 2018010028 A1 | 1/2018 | |
| WO | 2018071904 A1 | 4/2018 | |
| WO | 2018193272 A1 | 10/2018 | |
| WO | 2019134861 A1 | 7/2019 | |
| WO | 2020053846 A2 | 3/2020 | |
| WO | WO-2020053846 A2 * | 3/2020 | H02J 3/00 |
| WO | 2020073117 A1 | 4/2020 | |
| WO | 2020120975 A2 | 6/2020 | |
| WO | 2020124010 A1 | 6/2020 | |
| WO | 2020126282 A1 | 6/2020 | |
| WO | 2020126283 A1 | 6/2020 | |
| WO | 2020142408 A1 | 6/2020 | |
| WO | 2021002930 A1 | 1/2021 | |
| WO | 2021115634 A2 | 6/2021 | |
| WO | 2021195358 A1 | 9/2021 | |

* cited by examiner

CREATION OF A DIGITAL TWIN FOR AUTO-DISCOVERY OF HIERARCHY IN POWER MONITORING

BACKGROUND

An electrical system can include a hierarchy of relationships between components that function together within the electrical system. For example, an electrical system may include generators, transducers, servers, cooling devices, and the like connected in a complex way to support a telecommunications network. The electrical system can be changed over time to include more or fewer components or alter relationships between components based on the needs of the telecommunications system. These iterative, generational systems are commonly found in data centers and switch rooms used for telecommunications carriers.

Engineers conventionally use electrical drawings of an electrical system to understand the electrical system's hierarchy of relationships. However, the electrical drawings may be inaccurate if engineers do not update them to reflect changes made to components and the components' relationships. Inaccurate electrical drawings can lead to poor investment choices by an owner of the electrical system and inefficiency within the electrical system itself. For instance, an electrical system may require inclusion of a generator that needs to be replaced every five years, but the electrical drawings may not show the information needed to ascertain this requirement. This can result in the owner not allocating resources for replacing the generator and/or the electrical system failing when the generator stops working. Further, electrical drawings are conventionally flat files that cannot be used digitally at scale, unless an engineer manually creates a digital version. Manual digital replication of an electrical system is a time-intensive and often inaccurate process.

BRIEF DESCRIPTION OF THE DRAWINGS

Detailed descriptions of implementations of the present invention will be described and explained through the use of the accompanying drawings.

The technologies described herein will become more apparent to those skilled in the art from studying the Detailed Description in conjunction with the drawings. Embodiments or implementations describing aspects of the invention are illustrated by way of example, and the same references can indicate similar elements. While the drawings depict various implementations for the purpose of illustration, those skilled in the art will recognize that alternative implementations can be employed without departing from the principles of the present technologies. Accordingly, while specific implementations are shown in the drawings, the technology is amenable to various modifications.

DETAILED DESCRIPTION

The disclosed systems and methods enable creation of an accurate and reliable digital twin of a physical electrical system. The electrical system can include components such as servers, generators, data storage devices, network equipment, cooling devices, and the like. The electrical system may have corresponding drawings that show how its components were connected when the electrical system was first built, but if the electrical system was updated over time (e.g., components were added, components were moved/removed, connections were changed), those corresponding drawings may be inaccurate/outdated. Thus, the disclosed system uses output data from the electrical system to determine how the components in the system are actually connected.

Another challenge faced by engineers working with an electrical system is understanding how the electrical system acts with certain inputs and conditions. For example, an engineer may want to determine whether a first component would be overloaded if a second component was supplied with a specific input. In another example, the engineer may want to determine when a component will need to be replaced or becomes redundant. This is especially tricky without accurate drawings of the electrical system. Without understanding the connections and components used in an electrical system, the electrical system may waste energy and space, leading to greenhouse gas production that could have been avoided. The disclosed system remedies this by creating a digital representation of an electrical system that can accurately simulate the electrical system.

The system can receive data indicative of power profiles captured from a set of meters connected throughout an electrical system. The system compares change in power over time based on the power profiles and detects correlated changes in the data based on the comparison. The system combines data representing change in power over time for each of the meters into one system dataset that represents the electrical system. The system detects power fluctuations and echoes of the power fluctuations in the system dataset and uses the correlated changes, power fluctuations, and echoes to create a one-line diagram representing what components are connected and how the components are connected in the electrical system. For example, the system can do so by analyzing the magnitude of the echoes shown in the system dataset.

The system can create a digital twin of the electrical system using the one-line diagram. The digital twin is a computer model of the physical electrical system that a user can access via a graphical user interface (GUI). The user can interact with the digital twin to simulate what output data may be received from the meters under different modes of operation (e.g., based on particular settings, conditions, and/or inputs). A user can apply the simulation for fault analysis, capacity analysis, pinch point analysis, and the like. For example, the user can interact with the digital twin to determine when components may need to be replaced, how the electrical system would be affected by removing/adding components, and track power from source to load.

By using a system in this manner, the challenges of understanding updated electrical systems are mitigated. That is, the disclosed embodiments of the system facilitate creation of diagrams representing relationships (e.g., connections) between components in an electrical system and simulation of using the electrical system under different modes of operation. The disclosed technology can be used to facilitate analysis of electrical systems employed in data centers, switch rooms, or other facilities of a telecommunications network.

Moreover, given the inaccurate results of conventional systems used to understand updated electrical systems, many updated electrical systems are inefficient and waste energy running unneeded or duplicative components. Energy inefficiency can lead to excessive greenhouse gas emissions by the updated electrical systems. There is thus a need for improved methods for assessing electrical systems to detect components that may be using excess energy. The benefits and advantages of the implementations described herein result in reduced carbon emissions and improved energy efficiency by directly reducing power losses and thus energy consumption through updating/redesigning electrical systems. These improved electrical systems can reduce the need for costly new capacity by reducing energy usage and peak demand.

Various embodiments of the disclosed systems and methods are described. The following description provides specific details for a thorough understanding and an enabling description of these embodiments. One skilled in the art will understand, however, that the invention can be practiced without many of these details. Additionally, some well-known structures or functions may not be shown or described in detail for the sake of brevity. The terminology used in the description presented below is intended to be interpreted in its broadest reasonable manner, even though it is being used in conjunction with a detailed description of certain specific embodiments of the invention.

Although not required, embodiments are described below in the general context of computer-executable instructions, such as routines executed by a general-purpose data processing device, e.g., a networked server computer, mobile device, or personal computer (PC). Those skilled in the relevant art will appreciate that the invention can be practiced with other communications, data processing, or computer system configurations, including: Internet appliances, handheld devices, wearable computers, all manner of cellular or mobile phones, multi-processor systems, microprocessor-based or programmable consumer electronics, set-top boxes, network PCs, mini-computers, mainframe computers, media players, and the like. Indeed, the terms "computer," "server," and the like are generally used interchangeably herein and refer to any of the above devices and systems, as well as any data processor.

While aspects of the disclosed embodiments, such as certain functions, can be performed exclusively or primarily on a single device, some embodiments can also be practiced in distributed environments where functions or modules are shared among disparate processing devices that are linked through a communications network, such as a local area network (LAN), a wide area network (WAN), a wireless telecommunications network, or the Internet. In a distributed computing environment, program modules can be located in both local and remote memory storage devices.

Aspects of the invention can be stored or distributed on tangible computer-readable media, including magnetically or optically readable computer discs, hardwired or preprogrammed chips (e.g., EEPROM semiconductor chips), nanotechnology memory, biological memory, or other data storage media. In some embodiments, computer-implemented instructions, data structures, screen displays, and other data under aspects of the invention can be distributed over the Internet or over other networks (including wireless networks), on a propagated signal on a propagation medium (e.g., an electromagnetic wave(s), a sound wave) over a period of time, or they can be provided on any analog or digital network (packet-switched, circuit-switched, or other scheme). The description and associated drawings are illustrative examples and are not to be construed as limiting. This disclosure provides certain details for a thorough understanding and enabling description of these examples. One skilled in the relevant technology will understand, however, that the invention can be practiced without many of these details. Likewise, one skilled in the relevant technology will understand that the invention can include well-known structures or features that are not shown or described in detail, to avoid unnecessarily obscuring the descriptions of examples.

Wireless Communications System

Figure 1:
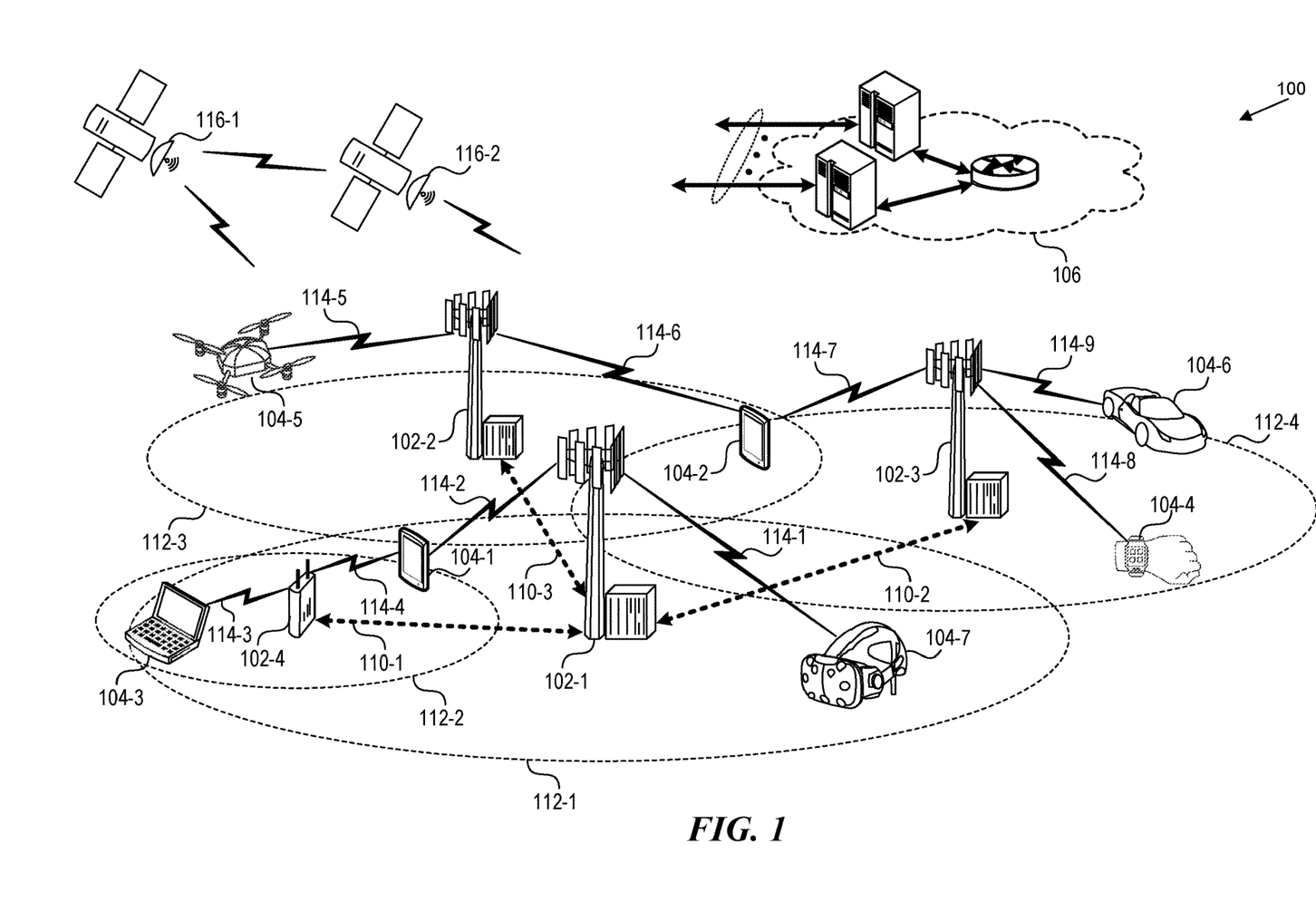
FIG. 1 is a block diagram that illustrates a wireless communications system that can implement aspects of the present technology.

FIG. 1 is a block diagram that illustrates a wireless telecommunications network 100 ("network 100") in which aspects of the disclosed technology are incorporated. The network 100 includes base stations 102-1 through 102-4 (also referred to individually as "base station 102" or collectively as "base stations 102"). A base station is a type of network access node (NAN) that can also be referred to as a cell site, a base transceiver station, or a radio base station. The network 100 can include any combination of NANs including an access point, radio transceiver, gNodeB (gNB), NodeB, eNodeB (eNB), Home NodeB or Home eNodeB, or the like. In addition to being a wireless wide area network (WWAN) base station, a NAN can be a wireless local area network (WLAN) access point, such as an Institute of Electrical and Electronics Engineers (IEEE) 802.11 access point.

The NANs of a network 100 formed by the network 100 also include wireless devices 104-1 through 104-7 (referred to individually as "wireless device 104" or collectively as "wireless devices 104") and a core network. The wireless devices 104-1 through 104-7 can correspond to or include network 100 entities capable of communication using various connectivity standards. For example, a 5G communication channel can use millimeter wave (mmW) access frequencies of 28 GHz or more. In some implementations, the wireless device 104 can operatively couple to a base station 102 over a long-term evolution/long-term evolution-advanced (LTE/LTE-A) communication channel, which is referred to as a 4G communication channel.

The core network 106 provides, manages, and controls security services, user authentication, access authorization, tracking, Internet protocol (IP) connectivity, and other access, routing, or mobility functions. The base stations 102 interface with the core network 106 through a first set of backhaul links (e.g., 51 interfaces) and can perform radio configuration and scheduling for communication with the wireless devices 104 or can operate under the control of a base station controller (not shown). In some examples, the base stations 102 can communicate with each other, either directly or indirectly (e.g., through the core network 106), over a second set of backhaul links 110-1 through 110-3 (e.g., X1 interfaces), which can be wired or wireless communication links.

The base stations 102 can wirelessly communicate with the wireless devices 104 via one or more base station antennas. The cell sites can provide communication coverage for geographic coverage areas 112-1 through 112-4 (also referred to individually as "coverage area 112" or collectively as "coverage areas 112"). The geographic coverage area 112 for a base station 102 can be divided into sectors making up only a portion of the coverage area (not shown). The network 100 can include base stations of different types (e.g., macro and/or small cell base stations). In some implementations, there can be overlapping geographic coverage areas 112 for different service environments (e.g., Internet of Things (IoT), mobile broadband (MBB), vehicle-to-everything (V2X), machine-to-machine (M2M), machine-to-everything (M2X), ultra-reliable low-latency communication (URLLC), machine-type communication (MTC), etc.).

The network 100 can include a 5G network 100 and/or an LTE/LTE-A or other network. In an LTE/LTE-A network, the term "eNBs" is used to describe the base stations 102, and in 5G new radio (NR) networks, the term "gNBs" is used to describe the base stations 102 that can include mmW communications. The network 100 can thus form a heterogeneous network 100 in which different types of base stations provide coverage for various geographic regions. For example, each base station 102 can provide communication coverage for a macro cell, a small cell, and/or other types of cells. As used herein, the term "cell" can relate to a base station, a carrier or component carrier associated with the base station, or a coverage area (e.g., sector) of a carrier or base station, depending on context.

A macro cell generally covers a relatively large geographic area (e.g., several kilometers in radius) and can allow access by wireless devices that have service subscriptions with a wireless network 100 service provider. As indicated earlier, a small cell is a lower-powered base station, as compared to a macro cell, and can operate in the same or different (e.g., licensed, unlicensed) frequency bands as macro cells. Examples of small cells include pico cells, femto cells, and micro cells. In general, a pico cell can cover a relatively smaller geographic area and can allow unrestricted access by wireless devices that have service subscriptions with the network 100 provider. A femto cell covers a relatively smaller geographic area (e.g., a home) and can provide restricted access by wireless devices having an association with the femto unit (e.g., wireless devices in a closed subscriber group (CSG), wireless devices for users in the home). A base station can support one or multiple (e.g., two, three, four, and the like) cells (e.g., component carriers). All fixed transceivers noted herein that can provide access to the network 100 are NANs, including small cells.

The communication networks that accommodate various disclosed examples can be packet-based networks that operate according to a layered protocol stack. In the user plane, communications at the bearer or Packet Data Convergence Protocol (PDCP) layer can be IP-based. A Radio Link Control (RLC) layer then performs packet segmentation and reassembly to communicate over logical channels. A Medium Access Control (MAC) layer can perform priority handling and multiplexing of logical channels into transport channels. The MAC layer can also use Hybrid ARQ (HARQ) to provide retransmission at the MAC layer, to improve link efficiency. In the control plane, the Radio Resource Control (RRC) protocol layer provides establishment, configuration, and maintenance of an RRC connection between a wireless device 104 and the base stations 102 or core network 106 supporting radio bearers for the user plane data. At the Physical (PHY) layer, the transport channels are mapped to physical channels.

Wireless devices can be integrated with or embedded in other devices. As illustrated, the wireless devices 104 are distributed throughout the system 100, where each wireless device 104 can be stationary or mobile. For example, wireless devices can include handheld mobile devices 104-1 and 104-2 (e.g., smartphones, portable hotspots, tablets, etc.); laptops 104-3; wearables 104-4; drones 104-5; vehicles with wireless connectivity 104-6; head-mounted displays with wireless augmented reality/virtual reality (AR/VR) connectivity 104-7; portable gaming consoles; wireless routers, gateways, modems, and other fixed-wireless access devices; wirelessly connected sensors that provide data to a remote server over a network; IoT devices such as wirelessly connected smart home appliances, etc.

A wireless device (e.g., wireless devices 104-1, 104-2, 104-3, 104-4, 104-5, 104-6, and 104-7) can be referred to as a user equipment (UE), a customer premise equipment (CPE), a mobile station, a subscriber station, a mobile unit, a subscriber unit, a wireless unit, a remote unit, a handheld mobile device, a remote device, a mobile subscriber station, a terminal equipment, an access terminal, a mobile terminal, a wireless terminal, a remote terminal, a handset, a mobile client, a client, or the like.

A wireless device can communicate with various types of base stations and network 100 equipment at the edge of a network 100 including macro eNBs/gNBs, small cell eNBs/gNBs, relay base stations, and the like. A wireless device can also communicate with other wireless devices either within or outside the same coverage area of a base station via device-to-device (D2D) communications.

The communication links 114-1 through 114-9 (also referred to individually as "communication link 114" or collectively as "communication links 114") shown in network 100 include uplink (UL) transmissions from a wireless device 104 to a base station 102, and/or downlink (DL) transmissions from a base station 102 to a wireless device 104. The downlink transmissions can also be called forward link transmissions while the uplink transmissions can also be called reverse link transmissions. Each communication link 114 includes one or more carriers, where each carrier can be a signal composed of multiple sub-carriers (e.g., waveform signals of different frequencies) modulated according to the various radio technologies. Each modulated signal can be sent on a different sub-carrier and carry control information (e.g., reference signals, control channels), overhead information, user data, etc. The communication links 114 can transmit bidirectional communications using frequency division duplex (FDD) (e.g., using paired spectrum resources) or time division duplex (TDD) operation (e.g., using unpaired spectrum resources). In some implementations, the communication links 114 include LTE and/or mmW communication links.

In some implementations of the network 100, the base stations 102 and/or the wireless devices 104 include multiple antennas for employing antenna diversity schemes to improve communication quality and reliability between base stations 102 and wireless devices 104. Additionally or alternatively, the base stations 102 and/or the wireless devices 104 can employ multiple-input, multiple-output (MIMO) techniques that can take advantage of multi-path environments to transmit multiple spatial layers carrying the same or different coded data.

In some examples, the network 100 implements 6G technologies including increased densification or diversification of network nodes. The network 100 can enable terrestrial and non-terrestrial transmissions. In this context, a Non-Terrestrial Network (NTN) is enabled by one or more satellites such as satellites 116-1 and 116-2 to deliver services anywhere and anytime and provide coverage in areas that are unreachable by any conventional Terrestrial Network (TN). A 6G implementation of the network 100 can support terahertz (THz) communications. This can support wireless applications that demand ultrahigh quality of service requirements and multi-terabits-per-second data transmission in the era of 6G and beyond, such as terabit-per-second backhaul systems, ultrahigh-definition content streaming among mobile devices, AR/VR, and wireless high-bandwidth secure communications. In another example of 6G, the network 100 can implement a converged Radio Access Network (RAN) and core architecture to achieve Control and User Plane Separation (CUPS) and achieve extremely low user plane latency. In yet another example of 6G, the network 100 can implement a converged Wi-Fi and core architecture to increase and improve indoor coverage.

System Overview

Figure 2:
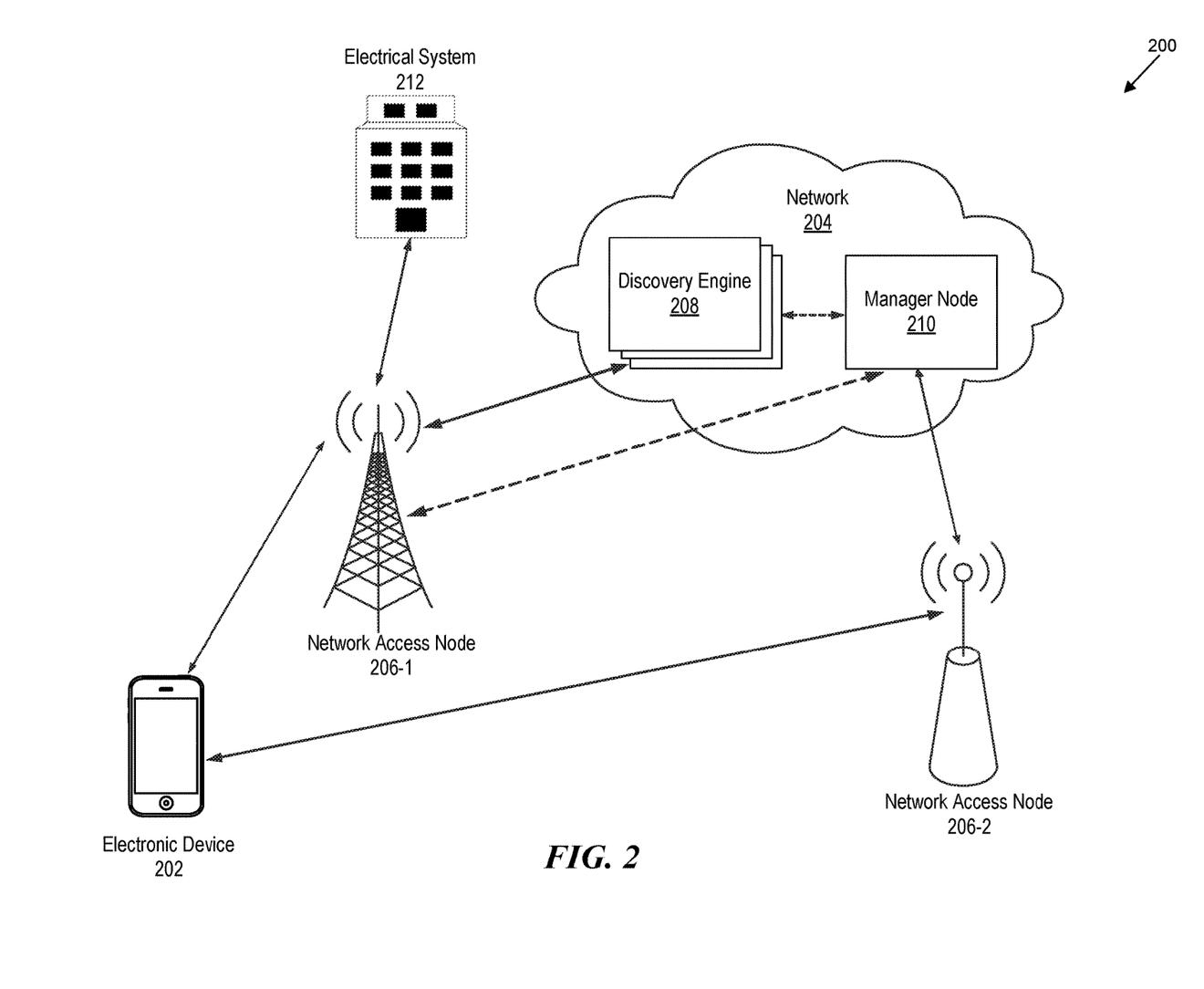
FIG. 2 is a block diagram that illustrates a system that creates digital twins of electrical systems.

FIG. 2 is a block diagram that illustrates a system 200 that creates digital twins of electrical systems. The system 200 includes an electronic device 202 that is communicatively coupled to one or more networks 204 via network access nodes 206-1 and 206-2 (referred to collectively as network access nodes 206).

The electronic device 202 is any type of electronic device that can communicate wirelessly with a network node and/or with another electronic device in a cellular, computer, and/or mobile communications system. Examples of the electronic device 202 include smartphones (e.g., Apple iPhone, Samsung Galaxy), tablet computers (e.g., Apple iPad, Samsung Note, Amazon Fire, Microsoft Surface), wireless devices capable of M2M communication, wearable electronic devices, movable IoT devices, and any other handheld device that is capable of accessing the network(s) 204. Although only one electronic device 202 is illustrated in FIG. 2, the disclosed embodiments can include any number of electronic devices.

The electronic device 202 can store and transmit (e.g., internally and/or with other electronic devices over a network) code (composed of software instructions) and data using machine-readable media, such as non-transitory machine-readable media (e.g., machine-readable storage media such as magnetic disks, optical disks, read-only memory (ROM), flash memory devices, and phase change memory) and transitory machine-readable transmission media (e.g., electrical, optical, acoustical, or other forms of propagated signals, such as carrier waves or infrared signals).

The electronic device 202 can include hardware such as one or more processors coupled to sensors and a non-transitory machine-readable media to store code and/or sensor data, user input/output (I/O) devices (e.g., a keyboard, a touchscreen, and/or a display), and network connections (e.g., an antenna) to transmit code and/or data using propagating signals. The coupling of the processor(s) and other components is typically through one or more buses and bridges (also referred to as bus controllers). Thus, a non-transitory machine-readable medium of a given electronic device typically stores instructions for execution on a processor(s) of that electronic device. One or more parts of an embodiment of the present disclosure can be implemented using different combinations of software, firmware, and/or hardware.

The network access nodes 206 can be any type of radio network node that can communicate with a wireless device (e.g., electronic device 202) and/or with another network node. The network access nodes 206 can be a network device or apparatus. Examples of network access nodes include a base station (e.g., network access node 206-1), an access point (e.g., network access node 206-2), or any other type of network node such as a network controller, radio network controller (RNC), base station controller (BSC), a relay, transmission points, and the like.

The system 200 depicts different types of network access nodes 206 to illustrate that the electronic device 202 can access different types of networks through different types of network access nodes. For example, a base station (e.g., the network access node 206-1) can provide access to a cellular telecommunications system of the network(s) 204. An access point (e.g., the network access node 206-2) is a transceiver that provides access to a computer system of the network(s) 204.

The network(s) 204 can include any combination of private, public, wired, or wireless systems such as a cellular network, a computer network, the Internet, and the like. Any data communicated over the network(s) 204 can be encrypted or unencrypted at various locations or along different portions of the networks. Examples of wireless systems include Wideband Code Division Multiple Access (WCDMA), High Speed Packet Access (HSPA), Wi-Fi, WLAN, Global System for Mobile Communications (GSM), GSM Enhanced Data Rates for Global Evolution (EDGE) Radio Access Network (GERAN), 4G or 5G wireless WWAN, and other systems that can also benefit from exploiting the scope of this disclosure.

The system 200 includes a manager node 210 that can use a discovery engine 208 to create one-line diagrams and digital twins of electrical systems. In some embodiments, the manager node 210 can include any number of server computers communicatively coupled to the electronic device 202 and electrical system 212 via the network access nodes 206. The manager node 210 can include combinations of hardware and/or software to process condition data, perform functions, communicate over the network(s) 204, etc. For example, server computers of the manager node 210 can include a processor, memory or storage, a transceiver, a display, operating system and application software, and the like. Other components, hardware, and/or software included in the system 200 that are well known to persons skilled in the art are not shown or discussed herein for brevity. Moreover, although shown as being included in the network(s) 204, the manager node 210 can be located anywhere in the system 200 to implement the disclosed technology.

The system 200 includes the discovery engine 208 that uses data received from meters in the electrical system 212 to determine types of components and relationships between components in the electrical system 212. The discovery engine 208 can create a one-line diagram representing the connections between the components of the electrical system. The discovery engine 208 can use the one-line diagram to create a digital twin of the electrical system 212. The digital twin is an ontology of the electrical system 212 that a user can interact with to simulate how the electrical system 212 operates under different modes of operation.

The electrical system 212 includes a variety of components that function together for an overall purpose. For example, the components of an electrical system 212 may function as part of a data center or switch room that performs operations for a telecommunications system. The components can include generators, transducers, computer room air conditioning (CRAC) units, computer room air handlers (CRAHs), servers, compressors, power sources, switches, meters, and the like. The meters are coupled to components/ connections throughout the electrical system 212 and may be located between each component or at various locations in the electrical system 212, such as where inputs and outputs are entered and received, respectively. The meters communicate data to the manager node 210, which in turn communicates the data to the discovery engine 208. In some embodiments, the discovery engine 208 receives the data directly from the meters. The manager node 210 and the discovery engine 208 may be local to the electrical system (e.g., in the same building) and/or may receive data from the meters of the electrical system 212 via the network 204.

The manager node 210 receives data indicative of a power profile (e.g., power data) from each meter in the electrical system 212. Each power profile represents power used by and/or generated by an associated component over a time period and can include wattage, amperage, and voltage captured at the meter's location in the electrical system 212. A power profile may represent direct current (DC) power or alternating current (AC) power, and the manager node 210 can receive both DC and AC power data from the meters in the electrical system 212. The manager node 210 can receive power profiles in real time from the meters in the electrical system 212 or can receive power profiles captured over the same time period at periodic or operator-specified intervals. The manager node 210 can store each power profile in association with an identifier of a respective meter locally or at a server connected via the network 204.

The manager node 210 can send the power data to the discovery engine 208. The manager node 210 may do so in response to receiving a request for a digital twin or one-line diagram of the electrical system 212. The manager node 210 may receive the request from a GUI presented at a connected electronic device 202. The manager node 210 can additionally or alternatively send the power data to the discovery engine 208 in response to detecting a change in power data (e.g., change in magnitude of power data, lack of power data received, etc.) from one of the meters. The time period of the power data may be specified by an operator via the GUI or may be all power data captured since the manager node 210 last sent power data to the discovery engine 208.

The discovery engine 208 receives power data for each meter from the manager node 210. The discovery engine 208 may store the power data in relation to an identifier of an associated meter locally or may access the power data via the manager node 210 as needed. The discovery engine 208 creates, using the power data of each meter, a set of delta data representing the change in power over time captured at the meter. The discovery engine 208 may create the delta data for a meter by taking the derivative of the power data of the meter and running the output through a low band filter. The discovery engine 208 can store the delta data in association with the identifier of the associated meter locally, at the manager node 210, or at a server connected via the network 204.

The discovery engine 208 compares each of the sets of delta data to one another to detect correlated changes in the sets of delta data. For example, the discovery engine 208 can calculate abnormal similarities between the sets of delta data, calculate normal behavior similarities between the sets of delta data, use a clustering algorithm with similarity as a distance measure on the sets of delta data, apply a pattern matching engine to the sets of delta data, and the like to detect correlated changes. In some embodiments, the discovery engine 208 uses a machine learning model to detect which sets of delta data include correlated changes. The discovery engine 208 can input the sets of delta data to the machine learning model, which outputs a likelihood of correlated changes being shown in the sets of delta data. The discovery engine 208 can determine that sets of delta data include correlated changes when the likelihood exceeds a threshold value. The machine learning model can be trained on training data that includes groups of sets of data representing change in power over time, where each group is labeled with a percentage of similarity of the sets of data or a Boolean value representing whether the sets of data depict correlated changes or not. The discovery engine 208 may retrain the machine learning model over time on new training data captured from the electrical system 212 and labeled by an external operator via a GUI.

The discovery engine 208 generates a system dataset representing the electrical system 212 by combining the sets of delta data into one dataset. In creating the system dataset, the discovery engine 208 may align the sets of delta data by time and associate each time with one or more points in the sets of delta data. The discovery engine 208 can detect power fluctuations in the system dataset. For example, the discovery engine 208 may determine that data representing a large change in power over a short time period represents a power fluctuation. In another example, the discovery engine 208 may determine that data representing a high (e.g., over a threshold) change in power over time represents a power fluctuation whereas data representing a low (e.g., under the threshold) change in power over time is not a fluctuation. The discovery engine 208 may tag portions of data in the system dataset that show power fluctuations or may store the data showing the power fluctuation locally or at the manager node 210 in association with an identifier of the meter that captured the data.

For each power fluctuation, the discovery engine 208 analyzes data in the system dataset captured after the beginning of the power fluctuation to find echoes of the power fluctuation. Each echo is a repeated pattern of the power fluctuation captured by meters other than the meter that initially captured the power fluctuation. Each echo may differ in magnitude from the power fluctuation. The discovery engine 208 can determine a time interval when the associated power fluctuation occurred and perform pattern matching with the subsequent data in the system dataset to detect echoes of the power fluctuation. The pattern matching may include calculating abnormal similarities, calculating normal behavior similarities, using a clustering algorithm, and/or applying a pattern matching engine to the data of the power fluctuation and the subsequent data in the system dataset. The discovery engine 208 may also apply a machine learning model to the data that includes the power fluctuation and the subsequent data of the system dataset. The discovery engine 208 receives sets of data of the system dataset that represent echoes from the machine learning model. The machine learning model may be trained on example system datasets, where each includes data labeled as a power fluctuation and data labeled as one or more echoes of the power fluctuation. The machine learning model may be retrained over time on new data received from the electrical system 212 and labeled by an external operator via a GUI. The discovery engine 208 can store data representing each echo locally or at the manager node 210. The discovery engine may store the data representing each echo in association with the data representing the related power fluctuation and an identifier of the meter that captured the data representing the echo.

The discovery engine 208 can create a one-line diagram of the electrical system 212. The one-line diagram is a representation of the electrical system 212 where schematic symbols and lines are used to represent the components and connections between the components of the electrical system 212. An example of a one-line diagram is described in relation to FIG. 3. The discovery engine 208 determines how many components each meter is connected to and what the components are based on the correlated data, power fluctuations, and echoes. For instance, the discovery engine 208 compares the changes in a set of correlated changes to one another using one or more statistical tests, such as a t-test, regression test, and/or correlation test. The discovery engine 208 also compares data representing power fluctuations and their associated echoes to one another using one or more statistical tests. The discovery engine 208 determines a confidence measure for each comparison and detects relationships that exist between data of comparisons with a confidence measure over a confidence threshold.

For detected relationships, the discovery engine 208 analyzes the results of the associated statistical tests to determine types of components that could be related to the compared data. For example, the discovery engine 208 can access an index of components contained within electrical systems and the relationships between power data output by each component when connected (directly or indirectly) with one of the other components. The discovery engine 208 can query the index with the results of each statistical test to receive identifiers of components that have a similar relationship when connected. For instance, the discovery engine 208 may determine that a set of correlated changes could be related to a power source and a CRAC unit. The discovery engine 208 can store the identifiers of the components in relation to the identifiers of meters that captured the data of the related comparison.

The discovery engine 208 can select an identifier of a component stored in relation to an identifier of a meter as being a component that is connected to the meter. In some embodiments, the discovery engine selects the identifier of a component with the most instances associated with each meter as the component connected to the meter. The discovery engine 208 builds a one-line diagram of the electrical system 212 by connecting schematic symbols representing selected components to symbols representing the corresponding meters. The discovery engine 208 can also add lines representing connections between the components and meters to the one-line diagram based on the relationships between components represented by the statistical tests. The discovery engine 208 can store the relationships in association with the connections in the one-line diagram. The discovery engine 208 may update the one-line diagram over time upon performing more analyses of data received from the meters of the electrical system 212. The discovery engine 208 can also maintain multiple versions of the one-line diagram of the electrical system 212, where each version captures the components and connections in the electrical system 212 over a different time period.

The discovery engine 208 can simulate the electrical system 212 based on the one-line diagram. For instance, the discovery engine 208 can create a digital twin of the electrical system 212 by adding interactive elements to the one-line diagram. The discovery engine 208 can couple the relationships stored in association with connections in the one-line diagram to interactive elements in the digital twin. When presented via a GUI, the interactive elements can receive simulation data via interactions from an external user. The simulation data can include different modes of operation of the electrical system 212, such as inputs to the electrical system 212, outputs from the electrical system 212, the removal or addition of components, weather conditions, settings of the components, and the like. In some embodiments, the simulation data also includes conditions that could be experienced by the electrical system 212, such as a particular temperature, weather conditions, lack of power, and the like.

After receiving the simulation data, the discovery engine 208 simulates the data that would be received at each meter in the electrical system 212 using the simulation data and relationships between components stored in relation to the digital twin. For instance, the discovery engine 208 can transmit a GUI with the digital twin to the manager node 210, which transmits the GUI for presentation at an electronic device 202. The manager node 210 sends inputs captured via the interactive elements to the discovery engine 208, and the discovery engine simulates the electrical system 212 running using those inputs and the relationships stored in association with the one-line diagram. The discovery engine 208 can transmit output data (e.g., outputs at each meter) from the simulation to the manager node 210 for presentation at the GUI. The output data can be presented as raw data or in one or more graphical representations.

Figure 3:
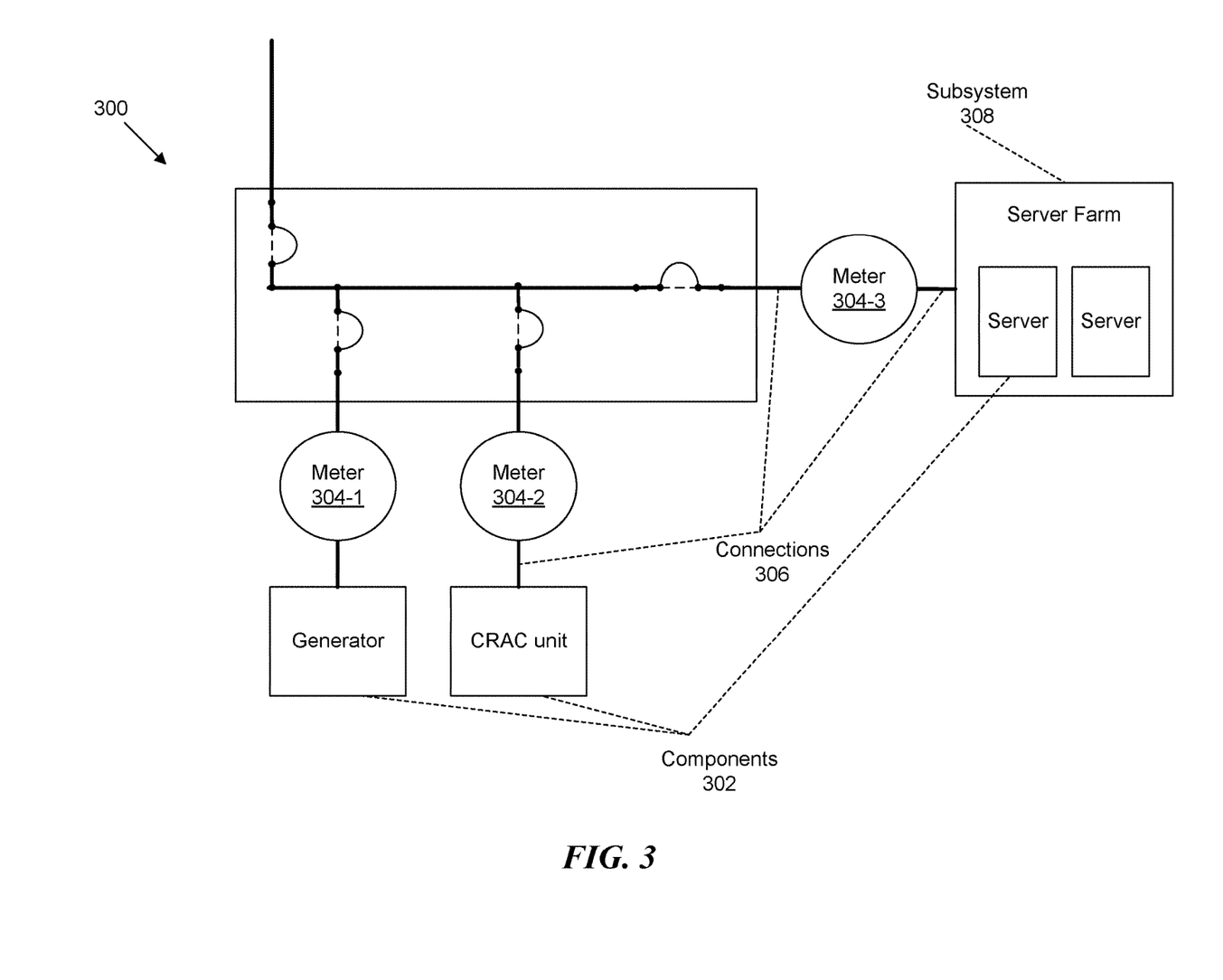
FIG. 3 is an example of a one-line diagram representing an electrical system.

FIG. 3 is an example of a one-line diagram 300 of an electrical system. The one-line diagram includes multiple components 302 (e.g., a generator, a CRAC unit, and two servers) and meters 304 linked together by connections 306. In some embodiments, the one-line diagram 300 may include more or different components and connections from those shown in FIG. 3. Further, the components 302 may be represented by different symbols to those shown in FIG. 3. The one-line diagram 300 may include subsystems 308 within the electrical system, such as a server farm that houses multiple servers. The discovery engine 208 (from FIG. 2) can determine that components 302 are linked together in a subsystem based on how close (e.g., connected) they are to one another and what their purpose within the electrical system is. For example, the servers shown in the subsystem 308 of FIG. 3 are located close together and are both used to store data. When displayed via a GUI as part of a digital twin, the one-line diagram 300 may include interactive elements overlaid on or next to the components 302 and connections 306 such that an external user can enter simulation data. The discovery engine 208 uses the simulation data and relationships stored in association with the connections 306 and components 302 in the diagram to simulate the electrical system.

Figure 4:
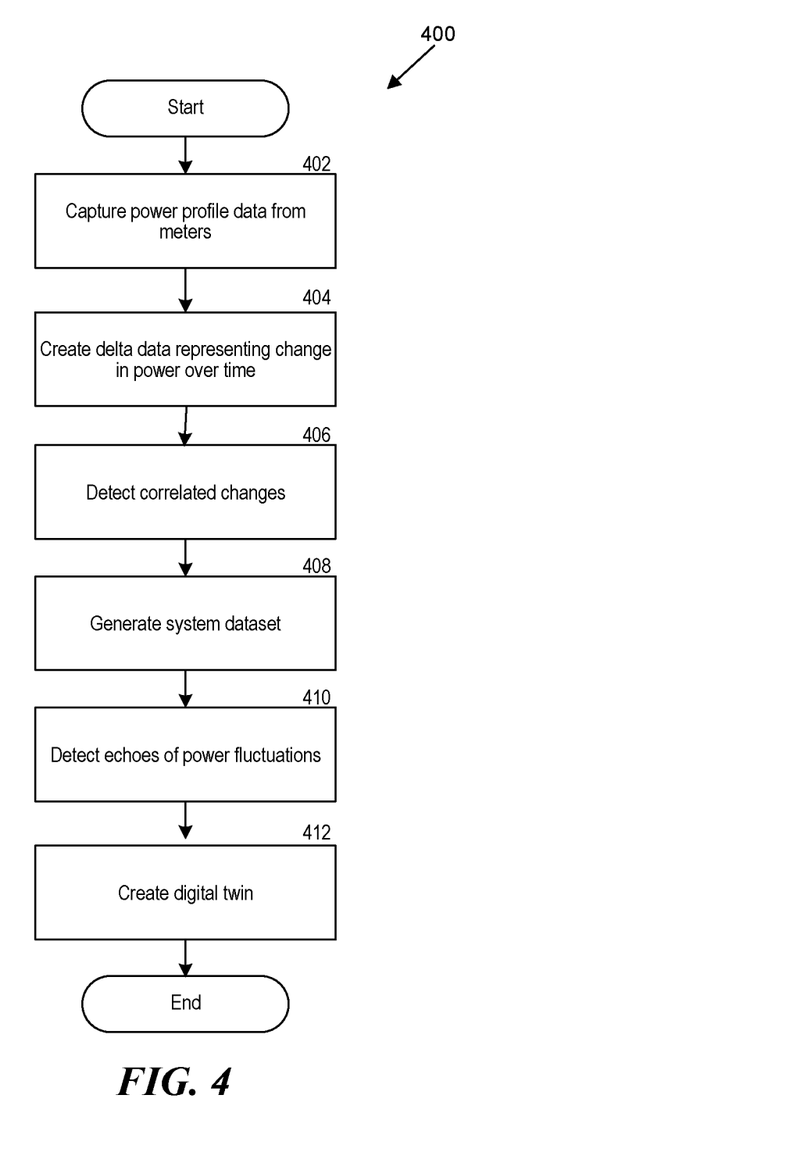
FIG. 4 is a flowchart of a process for generating a digital twin of an electrical system.

FIG. 4 is a flowchart of a process 400 for generating a digital twin of an electrical system of a telecommunications network. The discovery engine 208 can employ the process 400 to simulate operation of the electrical system based on simulation data. In some embodiments, the discovery engine 208 can perform additional or alternative steps to those shown in FIG. 4 or can perform the process for another electrical system.

The discovery engine 208 captures 402 data indicative of a power profile from each meter coupled to components in an electrical system from the manager node 210. The discovery engine 208 may communicate with the components via the network 204 to capture the data or may receive the data from the manager node 210. Each power profile is related to at least one component in the electrical system. The discovery engine 208 creates 404, based on the data indicative of the power profile, a set of delta data representing change in power over time captured at an associated meter. The discovery engine 208 may take the derivative of each of the data representative of a profile to create a set of delta data.

The discovery engine 208 detects 406 correlated changes based on a comparison of the sets of delta data from the set of meters, where the delta data was captured in at least partially overlapping time periods. For example, even if the delta data is based on power profiles captured at different time periods, the discovery engine 208 may align the sets of delta data by time to determine a time period that all or some of the sets of delta data correspond to, such that the discovery engine 208 can compare delta data for the same time period. The discovery engine 208 can compare the aligned delta data using pattern matching, a machine learning model, or another analysis method to detect correlated changes. The discovery engine generates 408, a system dataset, by combining the sets of delta data into one dataset (e.g., the system dataset). The system dataset is representative of the entire electrical system and describes the change in power over time of the electrical system.

The discovery engine 208 detects 410 echoes of power fluctuations in the system dataset. The discovery engine 208 may do so by performing pattern matching, using a machine learning model, or using another form of analysis. Each echo corresponds to a repeated pattern of a power fluctuation occurring at electrical components of the electrical system that are spatially separated. For example, a power fluctuation at a generator may be echoed in the output data of another component connected to the generator. The discovery engine creates 412, based on the correlated changes and detected echoes, a digital twin of the electrical system. The digital twin includes a one-line diagram representing connections between the components of the electrical system of the telecommunications network and interactive elements representing inputs and outputs of components, setting of components, external conditions, inclusion or exclusion of a component from the electrical system, and the like. The discovery engine 208 can simulate the electrical system using the digital twin. For example, in response to a new value being entered into an interactive element coupled to a component in the digital twin, the discovery engine 208 calculates output values of the other components in the electrical system based on the one-line diagram and the new value. The discovery engine 208 sends the output values for display at the interactive elements of the components in a GUI.

In some embodiments, to detect correlated changes, the discovery engine 208 can apply one or more statistical analyses to compared sets of data and determine confidence measures of results of the statistical analyses. For each confidence measure, if the confidence measure exceeds a confidence threshold, the discovery engine 208 determines that the compared sets of data are correlated. In some embodiments, the discovery engine 208 reduces energy usage of the electrical system by stopping/removing power from being output to one or more components of the electrical system based on outputs of the digital twin that indicate that the one or more components are redundant.

In some embodiments, the discovery engine 208 can detect the echoes by extracting a first set of data related to a first meter and a second set of data related to a second meter from the system dataset. The discovery engine 208 can compare the first set of data to the second set of data. The discovery engine 208 may detect echoed propagation from the first set of data in the second set of data and may detect a connection between a first component connected to the first meter and a second component connected to the second meter based on a magnitude of the echoed propagation. The discovery engine 208 may also determine a type of each of the first component and the second component based on existence of and magnitude of the echoed propagation. The discovery engine 208 can add the connection and first and second components to the one-line diagram.

Computer System

Figure 5:
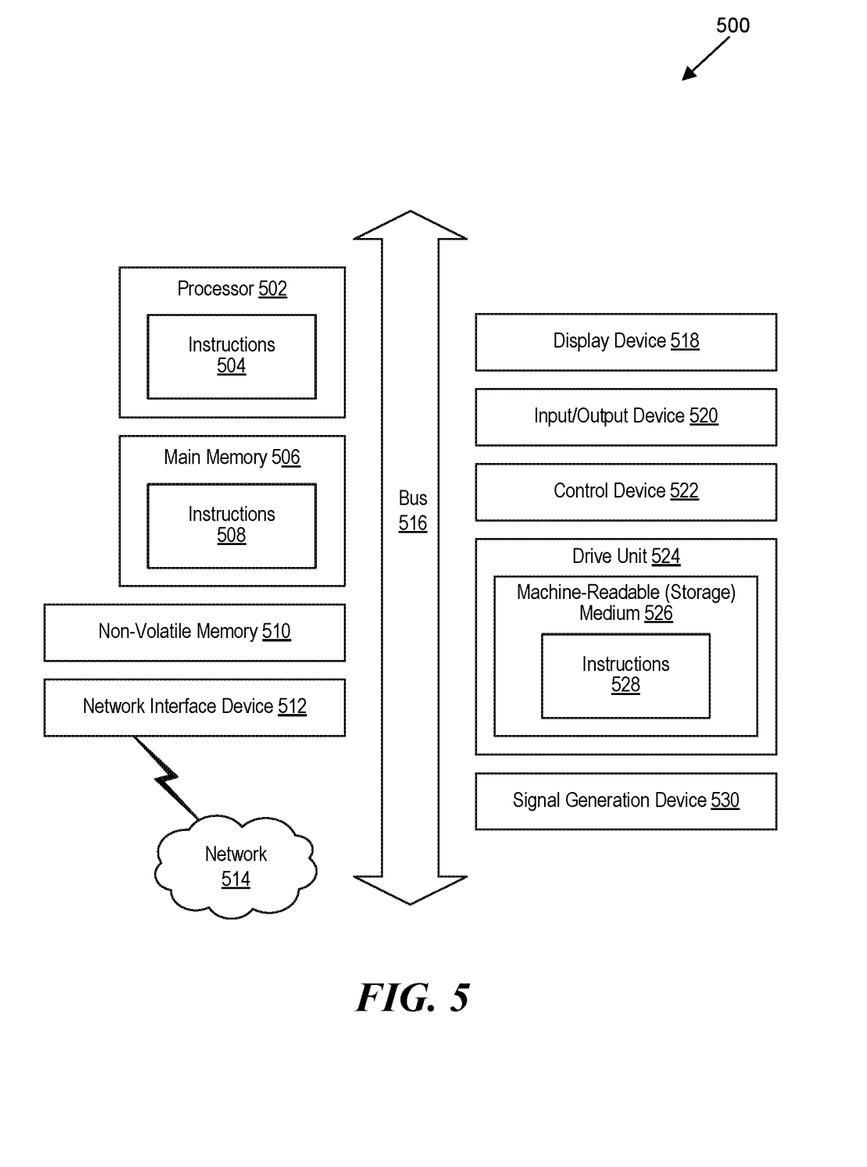
FIG. 5 is a block diagram that illustrates an example of a computer system in which at least some operations described herein can be implemented.

FIG. 5 is a block diagram that illustrates an example of a computer system 500 in which at least some operations described herein can be implemented. As shown, the computer system 500 can include: one or more processors 502, main memory 506, non-volatile memory 510, a network interface device 512, a video display device 518, an input/output device 520, a control device 522 (e.g., keyboard and pointing device), a drive unit 524 that includes a storage medium 526, and a signal generation device 530 that are communicatively connected to a bus 516. The bus 516 represents one or more physical buses and/or point-to-point connections that are connected by appropriate bridges, adapters, or controllers. Various common components (e.g., cache memory) are omitted from FIG. 5 for brevity. Instead, the computer system 500 is intended to illustrate a hardware device on which components illustrated or described relative to the examples of the figures and any other components described in this specification can be implemented.

The computer system 500 can take any suitable physical form. For example, the computer system 500 can share a similar architecture as that of a server computer, PC, tablet computer, mobile telephone, game console, music player, wearable electronic device, network-connected ("smart") device (e.g., a television or home assistant device), AR/VR systems (e.g., head-mounted display), or any electronic device capable of executing a set of instructions that specify action(s) to be taken by the computer system 500. In some implementations, the computer system 500 can be an embedded computer system, a system-on-chip (SOC), a single-board computer system (SBC), or a distributed system such as a mesh of computer systems, or can include one or more cloud components in one or more networks. Where appropriate, one or more computer systems 500 can perform operations in real time, in near real time, or in batch mode.

The network interface device 512 enables the computer system 500 to mediate data in a network 514 with an entity that is external to the computer system 500 through any communication protocol supported by the computer system 500 and the external entity. Examples of the network interface device 512 include a network adapter card, a wireless network interface card, a router, an access point, a wireless router, a switch, a multilayer switch, a protocol converter, a gateway, a bridge, a bridge router, a hub, a digital media receiver, and/or a repeater, as well as all wireless elements noted herein.

The memory (e.g., main memory 506, non-volatile memory 510, machine-readable medium 526) can be local, remote, or distributed. Although shown as a single medium, the machine-readable medium 526 can include multiple media (e.g., a centralized/distributed database and/or associated caches and servers) that store one or more sets of instructions 528. The machine-readable (storage) medium 526 can include any medium that is capable of storing, encoding, or carrying a set of instructions for execution by the computer system 500. The machine-readable medium 526 can be non-transitory or comprise a non-transitory device. In this context, a non-transitory storage medium can include a device that is tangible, meaning that the device has a concrete physical form, although the device can change its physical state. Thus, for example, non-transitory refers to a device remaining tangible despite this change in state.

Although implementations have been described in the context of fully functioning computing devices, the various examples are capable of being distributed as a program product in a variety of forms. Examples of machine-readable storage media, machine-readable media, or computer-readable media include recordable-type media such as volatile and non-volatile memory devices 510, removable flash memory, hard disk drives, optical disks, and transmission-type media such as digital and analog communication links.

In general, the routines executed to implement examples herein can be implemented as part of an operating system or a specific application, component, program, object, module, or sequence of instructions (collectively referred to as "computer programs"). The computer programs typically comprise one or more instructions (e.g., instructions 504, 508, 528) set at various times in various memory and storage devices in computing device(s). When read and executed by the processor 502, the instruction(s) cause the computer system 500 to perform operations to execute elements involving the various aspects of the disclosure.

Remarks

The terms "example," "embodiment," and "implementation" are used interchangeably. For example, references to "one example" or "an example" in the disclosure can be, but not necessarily are, references to the same implementation; and, such references mean at least one of the implementations. The appearances of the phrase "in one example" are not necessarily all referring to the same example, nor are separate or alternative examples mutually exclusive of other examples. A feature, structure, or characteristic described in connection with an example can be included in another example of the disclosure. Moreover, various features are described which can be exhibited by some examples and not by others. Similarly, various requirements are described which can be requirements for some examples but no other examples.

The terminology used herein should be interpreted in its broadest reasonable manner, even though it is being used in conjunction with certain specific examples of the invention. The terms used in the disclosure generally have their ordinary meanings in the relevant technical art, within the context of the disclosure, and in the specific context where each term is used. A recital of alternative language or synonyms does not exclude the use of other synonyms. Special significance should not be placed upon whether or not a term is elaborated or discussed herein. The use of highlighting has no influence on the scope and meaning of a term. Further, it will be appreciated that the same thing can be said in more than one way.

Unless the context clearly requires otherwise, throughout the description and the claims, the words "comprise," "comprising," and the like are to be construed in an inclusive sense, as opposed to an exclusive or exhaustive sense—that is to say, in the sense of "including, but not limited to." As used herein, the terms "connected," "coupled," and any variants thereof mean any connection or coupling, either direct or indirect, between two or more elements; the coupling or connection between the elements can be physical, logical, or a combination thereof. Additionally, the words "herein," "above," "below," and words of similar import can refer to this application as a whole and not to any particular portions of this application. Where context permits, words in the above Detailed Description using the singular or plural number may also include the plural or singular number, respectively. The word "or" in reference to a list of two or more items covers all of the following interpretations of the word: any of the items in the list, all of the items in the list, and any combination of the items in the list. The term "module" refers broadly to software components, firmware components, and/or hardware components.

While specific examples of technology are described above for illustrative purposes, various equivalent modifications are possible within the scope of the invention, as those skilled in the relevant art will recognize. For example, while processes or blocks are presented in a given order, alternative implementations can perform routines having steps, or employ systems having blocks, in a different order, and some processes or blocks may be deleted, moved, added, subdivided, combined, and/or modified to provide alternative or sub-combinations. Each of these processes or blocks can be implemented in a variety of different ways. Also, while processes or blocks are at times shown as being performed in series, these processes or blocks can instead be performed or implemented in parallel, or can be performed at different times. Further, any specific numbers noted herein are only examples such that alternative implementations can employ differing values or ranges.

Details of the disclosed implementations can vary considerably in specific implementations while still being encompassed by the disclosed teachings. As noted above, particular terminology used when describing features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed herein, unless the above Detailed Description explicitly defines such terms. Accordingly, the actual scope of the invention encompasses not only the disclosed examples, but also all equivalent ways of practicing or implementing the invention under the claims. Some alternative implementations can include additional elements to those implementations described above or include fewer elements.

Any patents and applications and other references noted above, and any that may be listed in accompanying filing papers, are incorporated herein by reference in their entireties, except for any subject matter disclaimers or disavowals, and except to the extent that the incorporated material is inconsistent with the express disclosure herein, in which case the language in this disclosure controls. Aspects of the invention can be modified to employ the systems, functions, and concepts of the various references described above to provide yet further implementations of the invention.

To reduce the number of claims, certain implementations are presented below in certain claim forms, but the applicant contemplates various aspects of an invention in other forms. For example, aspects of a claim can be recited in a means-plus-function form or in other forms, such as being embodied in a computer-readable medium. A claim intended to be interpreted as a means-plus-function claim will use the words "means for." However, the use of the term "for" in any other context is not intended to invoke a similar interpretation. The applicant reserves the right to pursue such additional claim forms either in this application or in a continuing application.

I claim:

1. A method for building a digital twin of an electrical system of a telecommunications network, the method comprising:
    for each meter in a set of meters coupled to electrical components of the electrical system:
        capturing, from the meter, data indicative of a power profile related to at least one component connected to the meter; and
        creating, based on the data indicative of the power profile, a set of delta data representing change in power over time;
    detecting correlated changes based on a comparison of the sets of delta data of the set of meters captured in at least partially overlapping time periods;
    generating a system dataset representative of the electrical system based on a combination of the sets of delta data;
    detecting echoes of power fluctuations in the system dataset, wherein each echo corresponds to a repeated pattern of a power fluctuation occurring at electrical components of the electrical system that are spatially separated; and creating, based on the correlated changes and the detected echoes, the digital twin including a one-line diagram representing connections between the components of the electrical system of the telecommunications network.

2. The method of claim 1, wherein creating the set of delta data comprises taking a derivative of the associated power profile.

3. The method of claim 1, wherein detecting echoes of power fluctuations in the system dataset comprises:
comparing a first set of data related to a first meter to a second set of data related to a second meter, wherein the first set of data and the second set of data are included in the system dataset;
detecting echoed propagation from the first set of data in the second set of data; and
detecting a connection between a first component connected to the first meter and a second component connected to the second meter based on a magnitude of the echoed propagation.

4. The method of claim 3, further comprising:
determining a type of each of the first component and the second component based on the magnitude of the echoed propagation.

5. The method of claim 1, wherein detecting correlated changes between the compared sets of data comprises:
applying one or more statistical analyses to compared sets of data;
determining confidence measures of results of the statistical analyses; and
in response to a confidence measure exceeding a confidence threshold, determining that the compared sets of data are correlated.

6. The method of claim 1, wherein the one-line diagram includes a set of interactive elements that represent inputs and outputs for each component, the method further comprising:
in response to a new value being entered into an interactive element of the component, outputting, at the interactive elements representing outputs of the components, values representing power data in the electrical system calculated based on the one-line diagram and the new value.

7. The method of claim 1, wherein the meters measure amperage, voltage, and wattage.

8. The method of claim 1, wherein a first power profile represents direct current (DC) power and a second power profile represents alternating current (AC) power.

9. The method of claim 1, wherein one or more of the meters are transducers.

10. The method of claim 1, wherein each power profile corresponds to a same time period.

11. A non-transitory, computer-readable storage medium comprising instructions recorded thereon that, when executed by at least one processor of a system of a wireless telecommunications network, cause the system to:
for each meter in a set of meters coupled to electrical components of an electrical system:
capture, from the meter, data indicative of a power profile related to at least one component connected to the meter; and
create, based on the data indicative of the power profile, a set of delta data representing change in power over time;
detect correlated changes based on a comparison of the sets of delta data of the set of meters captured in at least partially overlapping time periods;
generate a system dataset representative of the electrical system based on a combination of the sets of delta data;
detect echoes of power fluctuations in the system dataset, wherein each echo corresponds to a repeated pattern of a power fluctuation occurring at electrical components of the electrical system that are spatially separated; and
create, based on the correlated changes and the detected echoes, a digital twin including a one-line diagram representing connections between the components of the electrical system of the wireless telecommunications network.

12. The non-transitory, computer-readable storage medium of claim 11, wherein the instructions cause the system to create the set of delta data comprises taking a derivative of the associated power profile.

13. The non-transitory, computer-readable storage medium of claim 11, wherein the instructions that cause the system to detect echoes of power fluctuations in the system dataset further cause the system to:
compare a first set of data related to a first meter to a second set of data related to a second meter, wherein the first set of data and the second set of data are included in the system dataset;
detect echoed propagation from the first set of data in the second set of data; and
detect a connection between a first component connected to the first meter and a second component connected to the second meter based on a magnitude of the echoed propagation.

14. The non-transitory, computer-readable storage medium of claim 13, wherein the instructions further cause the system to:
determine a type of each of the first component and the second component based on the magnitude of the echoed propagation.

15. The non-transitory, computer-readable storage medium of claim 11, wherein the instructions that cause the system to detect correlated changes between the compared sets of data further cause the system to:
apply one or more statistical analyses to compared sets of data;
determine confidence measures of results of the statistical analyses; and
in response to a confidence measure exceeding a confidence threshold, determine that the compared sets of data are correlated.

16. The non-transitory, computer-readable storage medium of claim 11, wherein the one-line diagram includes a set of interactive elements that represent inputs and outputs for each component, the instructions further causing the system to:
in response to a new value being entered into an interactive element of the component, output, at the interactive elements representing outputs of the components, values representing power data in the electrical system calculated based on the one-line diagram and the new value.

17. The non-transitory, computer-readable storage medium of claim 11:

wherein one or more of the meters include transducers, and wherein the one or more meters measure amperage, voltage, and wattage.

18. The non-transitory, computer-readable storage medium of claim 11, wherein a first power profile represents direct current (DC) power and a second power profile represents alternating current (AC) power.

19. The non-transitory, computer-readable storage medium of claim 11, wherein the instructions further cause the system to:

reduce carbon emissions resulting from energy usage of the electrical system by stopping power from being output to one or more components of the electrical system based on output of the digital twin.

20. A system comprising:

at least one hardware processor; and at least one non-transitory memory storing instructions that, when executed by the at least one hardware processor, cause the system to:

for each meter in a set of meters coupled to electrical components of an electrical system of a telecommunications network:

capture, from the meter, data indicative of a power profile related to at least one component connected to the meter; and create, based on the data indicative of the power profile, a set of delta data representing change in power over time;

detect correlated changes based on a comparison of the sets of delta data of the set of meters captured in at least partially overlapping time periods;

generate a system dataset representative of the electrical system based on a combination of the sets of delta data;

detect echoes of power fluctuations in the system dataset, wherein each echo corresponds to a repeated pattern of a power fluctuation occurring at electrical components of the electrical system that are spatially separated; and create, based on the correlated changes and the detected echoes, a digital twin including a one-line diagram representing connections between the components of the electrical system of the telecommunications network.

* * * * *

UNITED STATES PATENT AND TRADEMARK OFFICE
CERTIFICATE OF CORRECTION

PATENT NO. : 11,899,516 B1  
APPLICATION NO. : 18/352053  
DATED : February 13, 2024  
INVENTOR(S) : Sean Seemann and John Coster Page 1 of 1

It is certified that error appears in the above-identified patent and that said Letters Patent is hereby corrected as shown below:

On the Title Page

Item (12) delete "Seemann" and insert -- Seemann et al. --.

After item (72) existing text Inventor: Sean Seemann, Seattle, WA, please add the following text:
-- John Coster, Sammamish, WA (US) --.

Signed and Sealed this
Twenty-second Day of October, 2024

Katherine Kelly Vidal
*Director of the United States Patent and Trademark Office*